(12) United States Patent
Erlebacher et al.

(10) Patent No.: US 7,084,696 B2
(45) Date of Patent: *Aug. 1, 2006

(54) CIRCUITS ASSOCIATED WITH FUSIBLE ELEMENTS FOR ESTABLISHING AND DETECTING OF THE STATES OF THOSE ELEMENTS

(75) Inventors: Seth A. Erlebacher, Pleasant Valley, NY (US); Paul D. Muench, Poughkeepsie, NY (US); George E. Smith, III, Wappingers Falls, NY (US); Gary Steinbrueck, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

This patent is subject to a terminal disclaimer.

(21) Appl. No.: 10/819,865

(22) Filed: Apr. 7, 2004

(65) Prior Publication Data

US 2005/0224586 A1 Oct. 13, 2005

(51) Int. Cl.
*H01H 37/76* (2006.01)

(52) U.S. Cl. .................................. 327/525

(58) Field of Classification Search .............. 327/77, 327/80, 81, 88, 89, 525
See application file for complete search history.

(56) References Cited

U.S. PATENT DOCUMENTS 6,384,664 B1 * 5/2002 Hellums et al. ............ 327/525

* cited by examiner

*Primary Examiner*—Jeffrey Zweizig
(74) *Attorney, Agent, or Firm*—Lynne L. Augspurger; James E. Murray

(57) ABSTRACT

A state detection circuit for a fusible element includes a differential sensing circuit that compares voltage at a detection point in a path containing the fusible element with that at a reference point in a path establishing a non-zero reference voltage. The paths are similarly configured except one contains the fusible element while the other contains a device establishing the reference voltage. The two paths in any given sensing circuit are located in close proximity to each other so that even though element parameters in the paths of different sensing circuits may vary significantly, those values track each other in the given sensing circuit. As a result, the normal non-zero value of the voltage at the reference point maintains a relationship to that at the detection point that enables the differential sensing circuit to detect between a fused and an unfused element irrespective of variation in circuit element parameters. In order to prevent detection circuits and other circuits on the chip being damaged, during blowing of the fusible elements, voltage level of the sensing circuits are chosen to isolate the detection circuits from the other circuits on the semiconductor chip and the excitation levels applied to the detection circuits are raised to maintain differential voltages in the detection circuits at sufficiently low levels to prevent damage.

12 Claims, 4 Drawing Sheets

CIRCUITS ASSOCIATED WITH FUSIBLE ELEMENTS FOR ESTABLISHING AND DETECTING OF THE STATES OF THOSE ELEMENTS

RELATED APPLICATION

Application Ser. No. 10/820,092, filed on even date herewith and entitled "Circuits Associated with Fusible Elements for Establishing and Detecting of the States of Those Elements", now U.S. Pat. No. 6,972,614, issued Dec. 06, 2005.

FIELD OF THE INVENTION

The present invention relates to circuits for use with fusible elements and more particularly to such circuits for use with fusible elements permanently storing information on semiconductor chips.

BACKGROUND OF THE INVENTION

In the fabrication of electrical circuits on semiconductor chips, processing variations often prevent the fabrication of components to the precision needed in large arrays. Those arrays use fusible elements in circuits to identify semiconductor chip types and in connection with redundant circuit elements to repair the arrays after fabrication by excluding bad elements and including substitute circuit elements. In chip identification circuits, the chip type is identified by the state of a plurality of the fusible elements where certain of the elements are blown to leave an open circuit while others are left conductive so that together fusible elements form a binary number that distinctively identifies the chip type. The binary number can then be read by applying voltage to the circuits containing each fusible element. Because of the above mentioned processing variations, circuit component differences make it very difficult for a detection circuit to detect whether a fuse circuit is open or conductive. Thus a chip whose part number is 010 could be misread as part number 011 due to the inability of the detection circuit to distinguish between an open and conductive fuse circuit for the least significant figure. Parity checking can be used to determine if an error has occurred in the case of the simple three bit binary number discussed above. However, in the reading out of a multicharacter chip identification number where each character is an 8 bit byte, multiple errors could require a sophisticated multiple error correcting system to locate and correct errors which in turn requires the use of valuable chip real estate. Further, the personalization of the fusible elements involves the use of high currents and voltages which could damage the detection circuits used in the detecting the state of the fusible elements and other circuits on the chip.

BRIEF DESCRIPTION OF THE INVENTION

In accordance with the present invention, the state detection circuit for each fusible element includes a differential sensing circuit that compares voltage at a detection point in a path containing the fusible element with that at a reference point in a path establishing a non-zero reference voltage. The two paths are similarly configured except one contains the fusible element while the other contains a device establishing the reference voltage. The two paths for any given sensing circuit are located in close proximity to each other so that even though element parameters in the paths of different sensing circuits may vary significantly, those values track each other in the given sensing circuit. As a result, the normal non-zero value of the voltage at the reference point maintains a relationship to that at the detection point that enables the differential sensing circuit to detect between a blown and an unblown element irrespective of variation in circuit element parameters. In order to prevent detection circuits and other circuits on the chip being damaged, during blowing of the fusible elements, devices of the sensing circuits are chosen to isolate the detection circuits from the other circuits on the semiconductor chip and the excitation levels applied to the detection circuits are raised to maintain differential voltages in the detection circuits at sufficiently low levels to prevent damage.

Therefore it is an object of the present invention to provide new detection and control circuits for use with electrically blowable fusible elements on semiconductor chips.

More particularly, it is an object of the present invention to provide such circuits which accurately detect the fusible elements state and prevent damage to the detection and other chip circuits during the blowing of such elements.

A further object of the invention is to provide fusible circuits for use in chip identification and redundancy circuits.

BRIEF DESCRIPTION OF THE DRAWINGS

These and other objects and advantages of the present invention could be best understood by reading the accompanying detailed description of the preferred embodiment of the invention while referring to the accompanying figures of which.

DETAILED DESCRIPTION OF THE INVENTION

Figure 1:
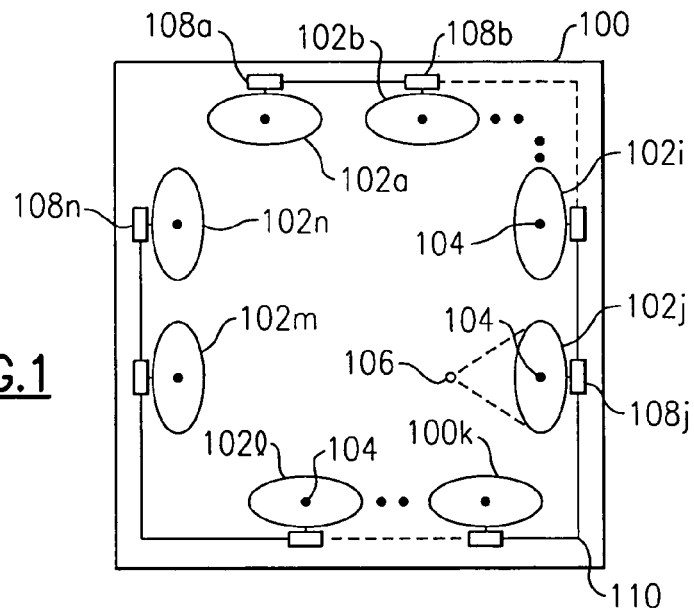
FIG. 1 is a schematic representation of a semiconductor chip containing fusible elements identifying the chip type.
Figure 2A:
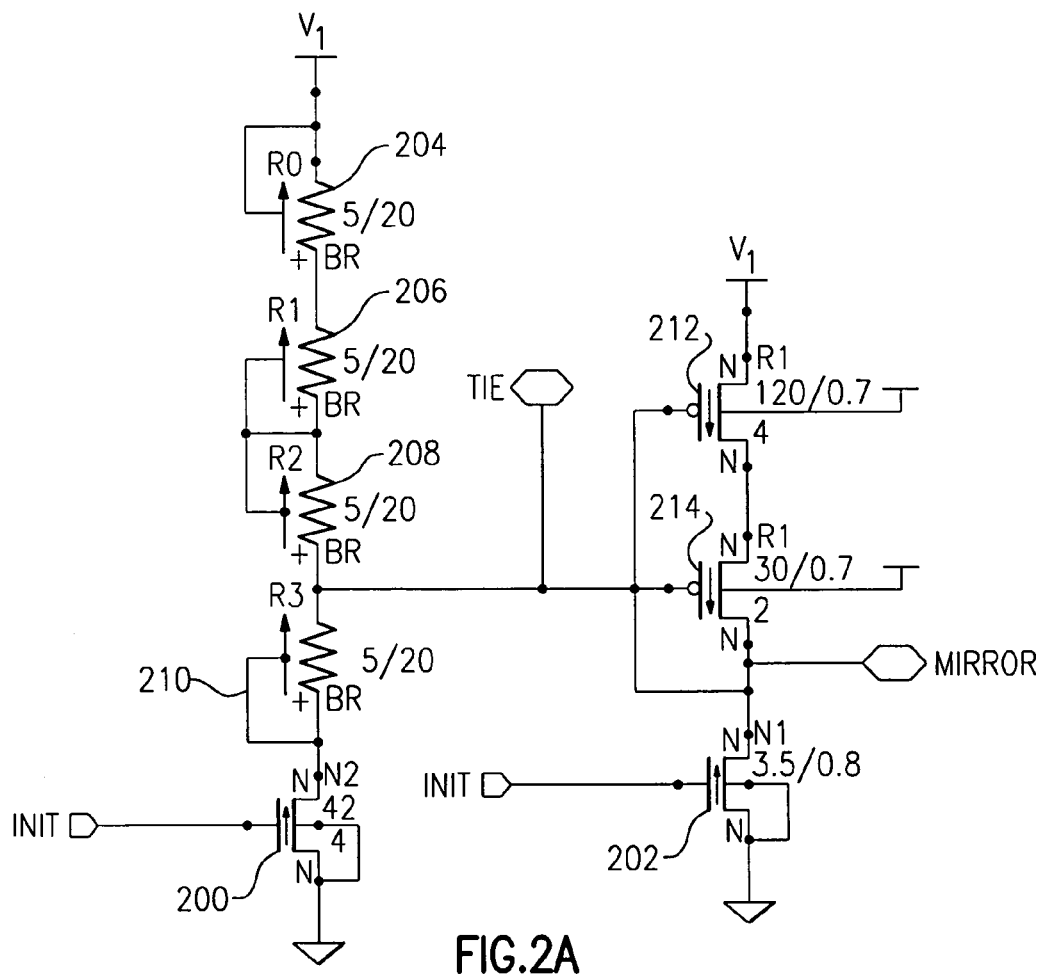
FIG. 2A is an electrical schematic for the level and current generating circuits for activating the sense circuits.
Figure 2B:
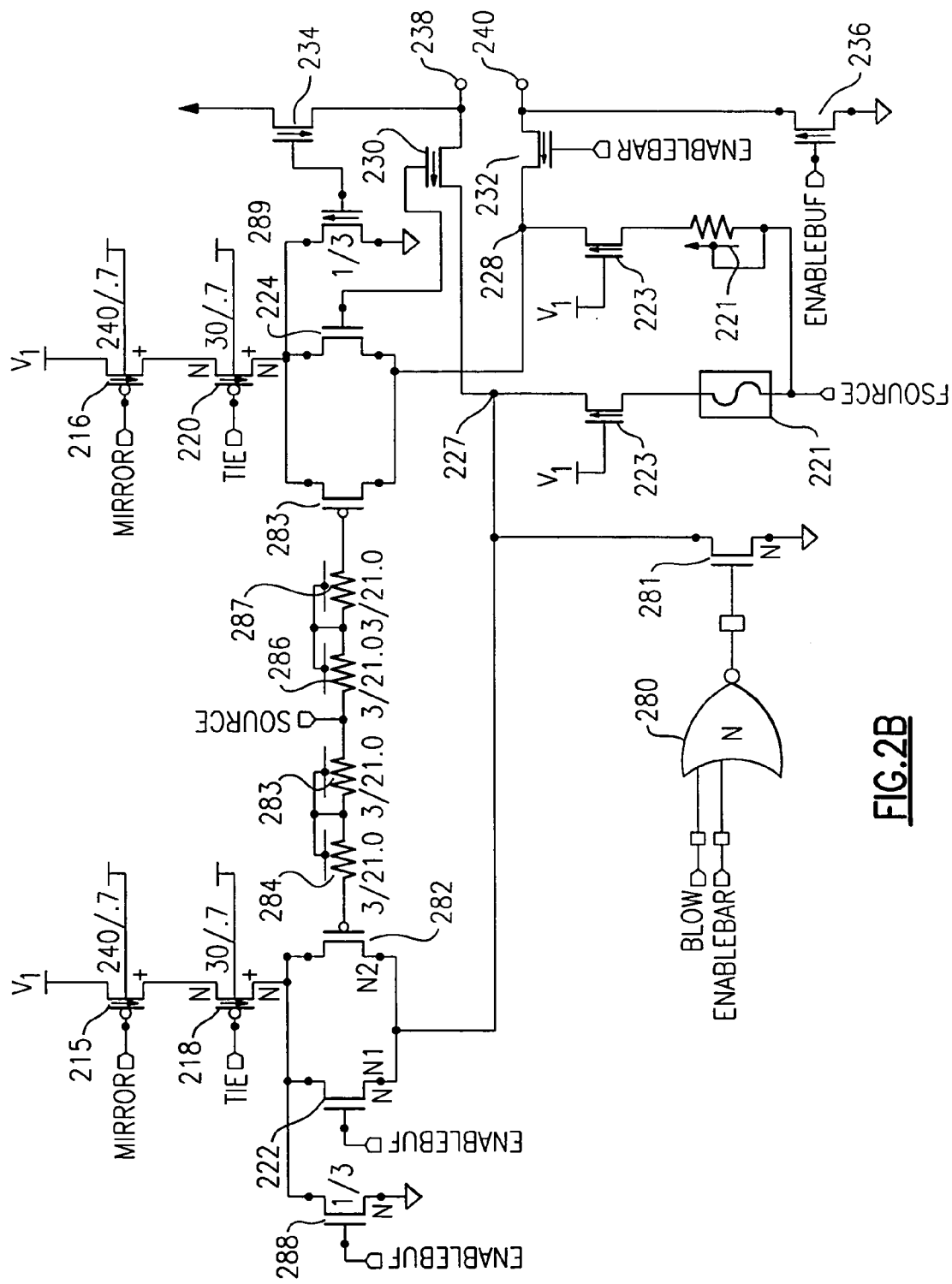
FIG. 2B is an electrical schematic of circuits for establishing and comparing the state of the fusible element.
Figure 2C:
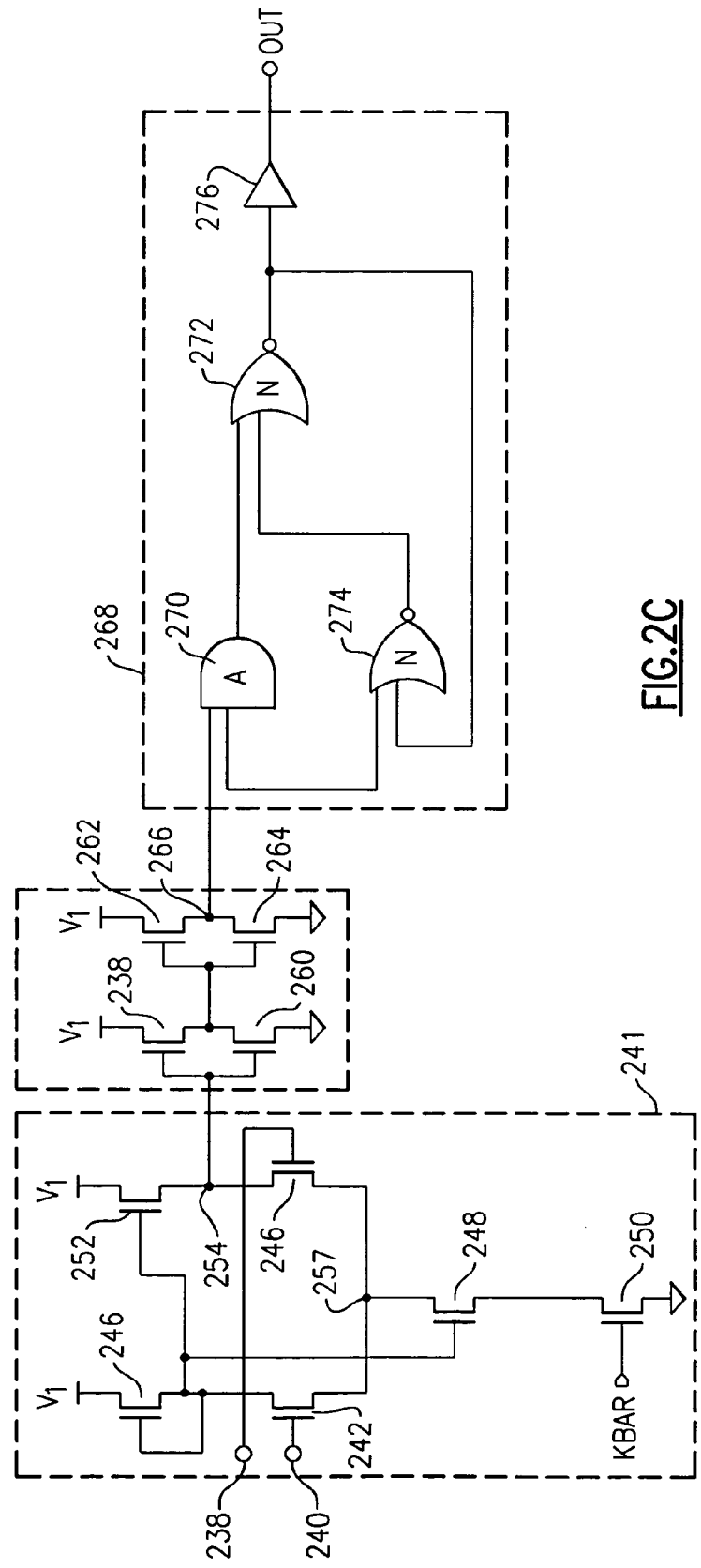
FIG. 2C is an electrical schematic of circuits for reading and retaining the state.

Referring now to FIG. 1, a semiconductor chip 100 is shown as containing a plurality of areas 102 each of which contains a fusible element 104 with the circuits illustrated FIGS. 2A to 2C associated with that particular fusible element. As can be seen, while a fusible element and its associated circuits can be located in any area of the chip, the fusible element, and its associated circuitry, are located in close proximity to each other. The size of the areas 102 are shown out of proportion to the chips size. The circuits actually use only a small portion 106 of the chip real estate.

The fusible elements are arranged in sets of eight digits, one of which is a parity check digit, to identify one character in the chip's identification number. The chip will contain many such groups of 8 in order to provide an appropriate alphanumeric sequence to identify the chip type. An output representing the state of each fusible element can be determined by the state of latches 108 associated with that element when the detection circuits are interrogated. The chip identification samples can then be read out by shifting the bits representing the states of all the digits out on shift register 110 formed of the latches.

Referring now to FIG. 2A, the INIT input to the gates of N-FET devices 200 and 202 controls the activation of the sensing circuit of FIG. 2B. The INIT input 200 is down at all times except during the occurrence of a sensing sequence. This means that the INIT input is not only down when the sense circuit is not in use, but also when the fusible element is being personalized. During the time that the INIT signal is down, the TIE and MIRROR reference voltages are at substantially V1 voltage. When the INIT voltage is on or positive it provides a positive voltage at the gates of both the 200 and 202 devices. As a result, current flows from V1 to ground through FET device 200 and resistors 204 to 210 to establish the positive TIE reference voltage, and current flows through devices 202 and FET devices 212 and 214 to establish a positive MIRROR voltage. The TIE reference voltage is used to gate on FET 214 and the gate of FET 212 is set at the MIRROR voltage level so that MIRROR voltage tracks the TIE voltage. All the elements of the reference setting circuits are physically located in close proximity to each other so that the characteristics of devices 200 to 214 track each other to maintain the difference between the TIE and MIRROR voltages within desired limits.

Referring now to FIG. 2B, the MIRROR reference voltage is provided to the gates of P-FET devices 215 and 216, while the TIE reference voltage is provided to the gates of P-FET devices 218 and 220. Devices 215 and 218 are connected in a path containing the fusible element 221 and N-FET devices 222 and 223. While devices 216 and 220 are connected in a path with N-FET devices 224 and 225 and resistive element 226. Because of proximity of the devices on the chip, characteristics of like devices in both paths are substantially the same. The paths are connected in parallel between the voltage sources $V_1$ and F SOURCE. $V_1$ is up whenever the chip is operating while F SOURCE is at ground potential at all times the chip is operating except when the state of the fusible element 221 is being set. With the TIE and MIRROR reference voltages up, devices 215 to 220 are off so that the same voltage at points 227 and 228 is indeterminate because both the state and reference paths are open circuits. With devices 215 to 225 conductive, current through devices 215, 218, 222 and 223 provide a voltage at output point 227 across the fusible element 221 and semiconductor device 223 and current flowing through device 216, 220, 224 and 225 provides a fuse reference voltage to terminal 228 across device 225 and resistor 226. If the fuse is blown, a high voltage will be provided at terminal 227. If the fuse is unblown, a lower voltage will be presented at terminal 227. The reference voltage at point 228 will remain the same whether the fuse path is blown or unblown. Thus a detectable difference between the two points 227 and 228 is present between the blown and unblown state. Like the circuits in FIG. 2A, the circuit elements of FIG. 2B are arranged in close proximity to one another so that their characteristics track one another to maintain the difference of the detectable levels at terminals 227 and 228 within a desired range.

With N-FET devices 230 and 232 biased conductive by a positive ENABLE BAR input and N-FET devices 234 and 236 biased non-conductive by the ENABLE BUF input, the sense outputs of 227 and 228 are provided to differential amplifier input terminals 238 and 240. As shown in FIG. 2C, the sense amplifier 241 contains N-FET and P-FET devices 242 to 252. This circuit takes signals 238 and 240 and sets the level at point 254 based on the relative levels 238 and 240 and sets the level at point 254 based on the relative levels 238 and 240. If the voltage at 238 across the fusible element 221 is above that reference voltage at point 257 the device 244 conducts to provide a down voltage indicating that the fuse is not blown. If the voltage at terminal 238 is lower than the reference voltage 252, then device 244 will not conduct providing an up voltage at output terminal 254.

The voltage at output terminal 254 is received by a double inverter circuit 256. Devices 258 to 264 of circuit 256 take the signal 254 and increases its level margins. The latch circuit 268 comprises AND circuit 270, NOR circuits 272 and 274 and an invert circuit 276. Latch 268 is triggered into operation by the INIT signal to store the signal representing the state of the fusible link by feeding a positive INIT input into the AND circuit 270 along with the fusible link state information at point 266. The NOR circuits 272 and 274 latch the state generated at point 266 while the invert circuit 276 inverts the latched signal so that a positive output indicates that an open fusible element results in a binary "0" output while a down output results in a binary "1" output. Again the circuit elements of the differential amplifier are in close proximity to one another so that the elements track each other maintaining the relevant values between the fuse and unfused state.

Above described is the sensing of the state of an element which is fused or unfused during a previous fusing operation. As can be seen referring back to FIG. 2B, the fusing of the element is accomplished by applying an increased voltage across the fusible element 221. For this purpose, a NOR circuit 280 is connected to the gate of NPN device 281 which is connected in series with the fusible element and device 223 between ground and the F SOURCE terminal. The F SOURCE voltage 258 is always increased from ground potential during the personalization operation. Whether the element 221 is to be fused is determined by the BLOW and ENABLE BAR inputs to the NOR circuit 280. If the BLOW signal is down at the same time as the ENABLE BAR circuit is down, the NOR circuit 260 raises the gate voltage on N-FET device 281 providing sufficient current through transistors 223 and fusible element 221 to blow out fusible element 221 leaving an open circuit across the fusible element 221. If the BLOW signal is up while the ENABLE BAR signal is down, the NOR circuit 280 provides a down level to device 281 so that devices are nonconductive and as a result, the path between the F SOURCE terminal and ground voltage is open and the fusible element remains conductive.

Figure 3A:
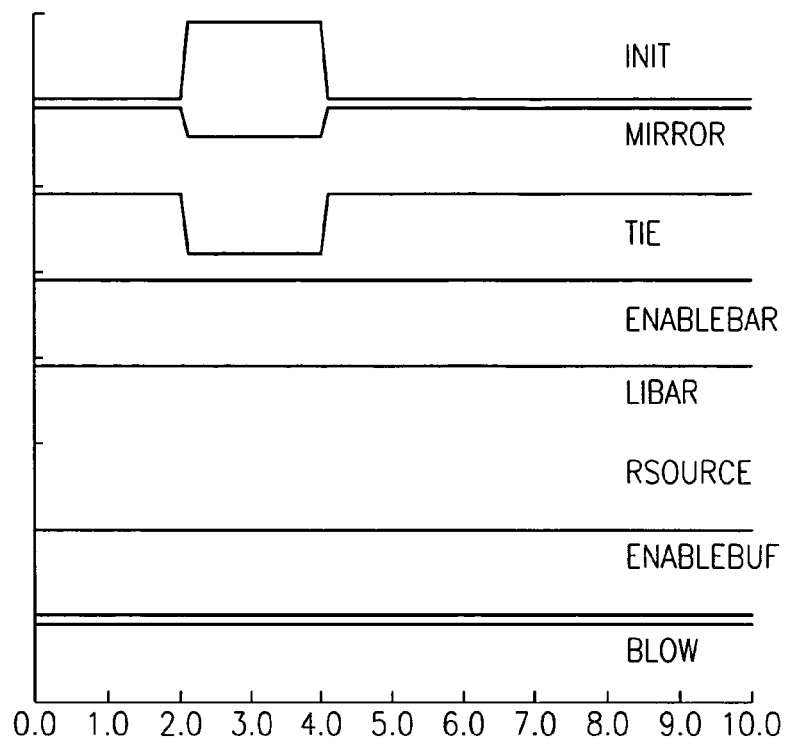
FIG. 3A is a schematic diagram showing a plot of typical applied and output voltages of the circuit of FIGS. 2A to 2C during the detection of the state of a fusible element.
Figure 3B:
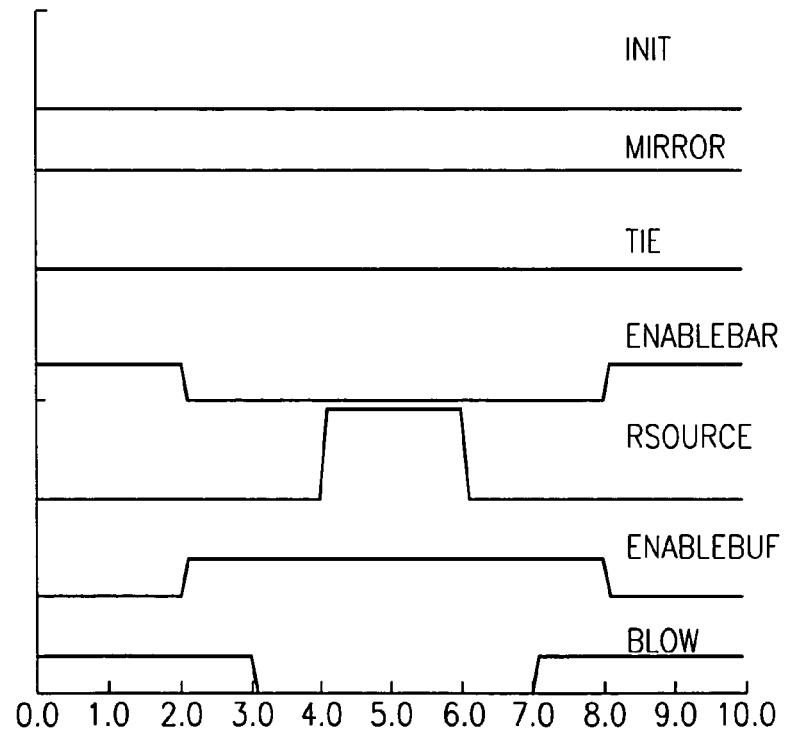
FIG. 3B is a schematic diagram showing a plot of typical applied and output voltages during the personalization of the fusible elements.

In addition to its use in the blowing fuse the F SOURCE voltage is applied to gates of N-FET devices 283 and 282 through resistors 284 to 287 to prevent circuit elements of the chip from being affected by the high F SOURCE voltage. At the same time the ENABLE BAR voltage is reduced to turn devices 222, 224, 230 and 232 off. Further, ENABLE BAR voltage is used to short the terminals 238 and 240 to ground through devices 234 and 236 and to turn on devices 288 and 289 to isolate the fusible element in reference circuits from other elements on the circuit chip. FIGS. 3A and 3B contain the voltage patterns during the detection and personalization of the fusible elements, respectively.

While we have described one embodiment of the invention, those skilled in the art may or may not anticipate changes in this embodiment. For instance, as mentioned above, while the above described embodiment deals with storing information on semiconductor chips, the fusible element circuits can also be used in connection with the use of redundant circuits. Therefore it should be understood that the invention is not limited to this embodiment but covers it and other embodiments within the intent and spirit of the attached claims.

What is claimed is:

1. An identification circuit for establishing and sensing of a fusible element used in on-chip identification of the chip's type comprising:
    a circuit establishing control signals for turning the identification circuit on and off for sensing with an initiating signal remains off during the personalization of the fusible element;
    dual paths energized by the control signals generated by the level setting circuit to energize one path through the fusible element to provide a state level and the other path through a reference path which provides a reference voltage level which is distinguishable from both the blown and unblown states of the fusible element wherein, the dual paths are each a series circuit that includes switching devices responsive to the control signals for making and breaking the reference paths and isolation devices in series with the switching devices to isolate them and other circuit chip elements from the fusible element while the fusible element is being personalized wherein, the isolation devices include two devices in series with the personalizing FET a first of which is responsive to the fusing source of potential to be biased conductive during the personalization step and a second of which is turned on during personalization to isolate the other circuits in the loop from the personalization process;
    differential sensing circuit for comparing the reference voltage level to the state level to provide a signal indicating the state of the fusible element;
    protection circuitry changing voltage levels on the dual paths and the differential sensing circuit to protect the circuit during an operation in which the state of the fusible element is set; and
    a fusible element personalization circuit to establish the state of the fusible element wherein, the personalization circuit includes a personalizing FET and a source of potential capable of fusing the fusible element arranged in series with the fusible element; and a NOR circuit controlling the personalization FET responsive to the presence or absence of a blow signal to establish the state of the fusible element.

2. The identification circuit of claim 1 including coupling and decoupling devices to connect and disconnect the dual paths to the differential sensing circuit to the dual paths.

3. The identification circuit of claim 2 wherein, the coupling and decoupling devices includes one coupling device for coupling one input terminal of the differential sensing circuit to the fusible element path and another coupling device for coupling the reference path to another input terminal of the differential sensing circuit to the reference path during sensing the state of fusible element.

4. The identification circuit of claim 2, wherein, the coupling and decoupling devices includes two FET devices each for connecting one of the input terminals of the differential sensing circuit to ground during personalization of the fusible element.

5. The identification circuit of claim 1 including a latching circuit coupled to the differential sensing circuit for retaining the sensed state of the fusible element.

6. The identification circuit of claim 5 wherein, said latching circuit is a state in a shift register for shifting the sensed state of the fusible element off the semiconductor chip.

7. A circuit for controlling the state of a fusible element used in a semiconductor chip comprising:
    a circuit establishing control signals for turning the circuit on and off for sensing with an initiating signal which signal remains off during the establishing the state of the fusible element;
    dual paths energized by the control signals generated by the state setting circuit to energize one path through the fusible element to provide a state level and the other path through a reference path which provides a reference voltage level which is distinguishable from both the blown and unblown states of the fusible element wherein, the dual paths are each a series circuit that includes switching devices responsive to the control signals for making and breaking the reference paths and isolation devices in series with the switching devices to isolate them and other circuit chip elements from the fusible element while the fusible element is being personalized wherein, the isolation devices include two devices in series with the personalizing FET a first of which is responsive to the fusing source of potential to be biased conductive during the personalization step and a second of which is turned on during personalization to isolate the other circuits in the lop from the personalization process;
    differential sensing circuit for comparing the reference voltage level to the state level to provide a signal indicating the state of the fusible element;
    protection circuitry changing the voltage levels on the dual paths and the differential sensing circuit to protect the circuit during an operation in which the state of the fusible element is set; and
    a fusible element personalization circuit to establish the state of the fusible element wherein, the personalization circuit includes a personalizing FET and a source of potential capable of fusing the fusible element arranged in series with the fusible element; and a NOR circuit controlling the personalization FET responsive to the presence or absence of a blow signal to establish the state of the fusible element.

8. The circuit of claim 7 including coupling and decoupling devices to connect and disconnect the dual paths to the differential sensing circuit to the dual paths.

9. The circuit of claim 8 wherein,
    the coupling and decoupling devices includes one coupling device for coupling one input terminal of the differential sensing circuit to the fusible element path and another coupling device for coupling the reference path to another input terminal of the differential sensing circuit to the reference path during sensing the state of fusible element.

10. The circuit claim 8 wherein,
    the coupling and decoupling devices includes two FET devices each for connecting one of the input terminals of the differential sensing circuit to ground during personalization of the fusible element.

11. The circuit of claim 7 including a latching circuit coupled to the differential sensing circuit for retaining the sensed state of the fusible element.

12. The circuit claim 11 wherein,
    said latching circuit is a state in a shift register for shifting the sensed state of the fusible element off the semiconductor chip.

* * * * *